Oct. 28, 1952 B. F. WHEELER ET AL 2,616,037

HIGH-FREQUENCY MIXER CIRCUIT

Filed April 28, 1950 2 SHEETS—SHEET 1

INVENTORS
BENJAMIN F. WHEELER
& HOWARD R. MATHWICH
BY
Charles H. Brown
ATTORNEY

Oct. 28, 1952 B. F. WHEELER ET AL 2,616,037

HIGH-FREQUENCY MIXER CIRCUIT

Filed April 28, 1950 2 SHEETS—SHEET 2

INVENTORS
BENJAMIN F. WHEELER
& HOWARD R. MATHWICH
BY
Charles H. Brown
ATTORNEY

Patented Oct. 28, 1952

2,616,037

UNITED STATES PATENT OFFICE 2,616,037

HIGH-FREQUENCY MIXER CIRCUIT

Benjamin F. Wheeler and Howard R. Mathwich, Haddonfield, N. J., assignors to Radio Corporation of America, a corporation of Delaware Application April 28, 1950, Serial No. 158,626

11 Claims. (Cl. 250—20)

This invention relates to high frequency mixer circuits. More particularly, it relates to a high frequency harmonic mixer useful in radio receivers and employing an enclosed electrical resonator. Such an eletcrical resonator is sometimes referred to as a cavity resonator.

An object of the invention is to enable most effective application of an incoming signal to the detector element of a mixer circuit.

Another object is to minimize unavoidable losses of signal energy into the local oscillator supply circuit in mixer devices.

A further object is to facilitate the effective coupling of energy from a local oscillator into a harmonic mixer cavity resonator of a receiver.

Harmonic mixers are known. Such known mixers serve to beat oscillations of two different frequencies from different sources to produce an output of a third frequency which may be the sum or difference frequency of the applied waves. Generally, in such harmonic mixers the signal or input frequency differs appreciably from the local oscillator frequency to an extent which is greater than in the ordinary superheterodyne mixer circuit of a radio receiver. Although harmonic mixers have slightly higher conversion loss, there is a considerable advantage in their use at the higher radio frequencies where it becomes difficult to supply local oscillator energy at the required frequency. One difficulty heretofore experienced in harmonic mixers, particularly when used at relatively high radio frequencies, is that there are appreciable losses of the signal energy in the mixer circuit.

The present invention overcomes the foregoing difficulty by preventing the signal energy from entering the local oscillator supply circuit in the mixer device, while enabling the signal energy to be most effectively applied to a detector or crystal device. This result is achieved by the use of a line stub or circuit of distributed constants so associated with the harmonic mixer cavity, that it acts at the signal frequency as a low impedance path across the oscillator supply. In one embodiment of the invention, a coaxial line type of harmonic mixer cavity resonator is employed and an auxiliary line stub is inserted into the hollow inner conductor of the resonator. This line stub may have an electrical length equal to that of the inner conductor of the resonator at the signal frequency, although its overall physical length may be smaller, and in some cases larger, than the physical length of the inner conductor. The signal frequency is at least twice that of the local oscillator. Local oscillations are supplied to the line stub at a location adjacent the point of connection to a non-linear crystal detector. Energy of the higher signal frequency is effectively bypassed at this point and prevented from entering the local oscillator supply. The detector produces an output frequency which is the result of interaction between a harmonic of the applied local oscillator frequency and the higher signal frequency. In one embodiment, the auxiliary line sub is an open-ended line electrically equal to a quarter of a wavelength or an odd multiple thereof at the signal frequency. In another embodiment, the auxiliary line stub is connected at one end to the surrounding inner conductor of the coaxial cavity resonator and equal to a half wavelength or a multiple thereof at the signal frequency. The detector, for example a silicon crystal, is connected between the cavity resonator and the output circuit for deriving energy of the intermediate frequency. This intermediate frequency may be the sum or difference of the signal frequencies and a harmonic of the local oscillator supply frequency.

A more detailed description of the invention follows in conjunction with a drawing wherein.

Throughout the figures of the drawing, the same parts are designated by the same reference numerals, while equivalent parts are given prime designations.

Figures 1, 5:
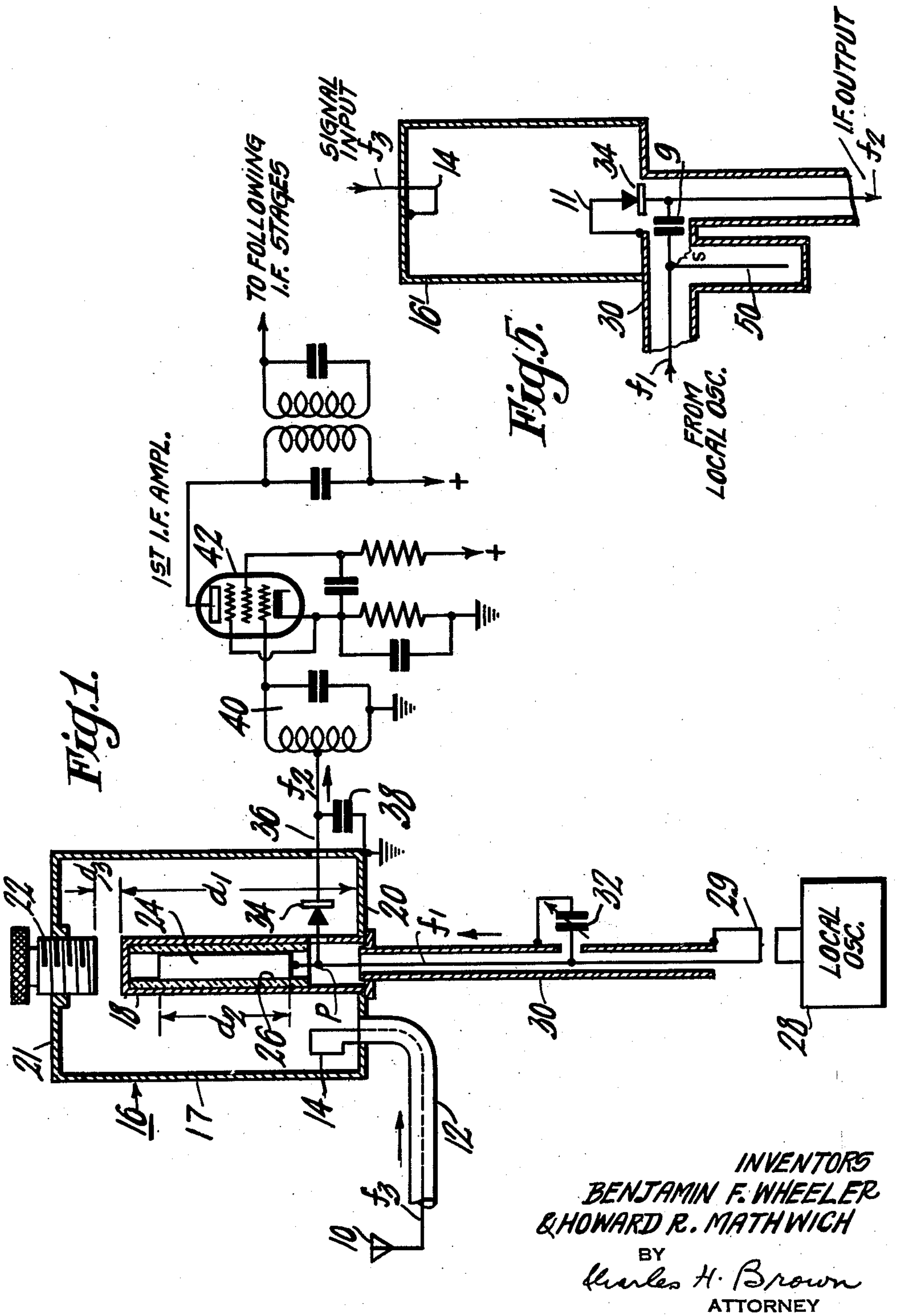
Fig. 1 illustrates one embodiment of a high frequency harmonic mixer cavity resonator of the invention used in a radio receiver. This embodiment utilizes an open-ended auxiliary line stub within but spaced from the inner conductor of the coaxial line resonant cavity.
Fig. 5 illustrates another embodiment of a harmonic mixer circuit of the invention employing an electrical cavity resonator devoid of an inner conductor. In this case, the auxiliary stub is external to the signal frequency cavity resonator.

Fig. 1 shows the harmonic mixer circuit of the invention positioned between the receiving antenna 10 and the intermediate frequency stage 42 of a radio receiver. The radio waves received on antenna 10 are supplied to coaxial transmission line 12, in turn, coupled by loop 14 to the coaxial resonator 16. Resonator 16 comprises an outer conductor 17 and a hollow inner conductor 18, both of which are directly connected together by a metallic end plate 20. An oppositely disposed metallic end plate 21 serves to completely enclose the resonator. End plate 21 is provided with an adjustable screw 22 for tuning the resonator. Any variation in distance $d_3$ between the adjustable screw 22 and the free end of the inner conductor 18 varies the capacity therebetween and, hence, the resonant frequency of tht resonator. The dimension $d_1$ of inner conductor 18 may be a quarter of a wavelength or any odd multiple thereof at the signal frequency including the effects of capacity $d_3$. Positioned within the inner conductor 18 is a transmission line stub or rod-like conductor 24. A dielectric tube 26 with a dielectric constant appreciably greater than one spaces stub 24 from the inner conductor 18. The dielectric tube 26 extends beyond the ends of the line stub insert 24 and may completely enclose it if desired. The dimension $d_2$ of the line stub 24 is such that the electrical length including the effects of dielectric 26 is a quarter wavelength or any suitable odd multiple thereof at the signal frequency $f_3$. A source of local oscillations 28 is coupled through a coaxial line 30 to that end of line stub 24 nearest the end plate 20. A tuning capacitor 32 serves to tune the local oscillator coaxial supply line 30 to a desired frequency $f_1$. A non-linear crystal detector 34, for example, a silicon or a germanium crystal, is connected between one end of the stub 24 at junction point P and the output lead 36. That end of crystal 34 which is connected to lead 36 is bypassed to ground by capacitor 38. Lead 36 receives from the harmonic cavity resonator an intermediate or beat frequency $f_2$ which is the sum or difference of the frequencies $f_3$ and a multiple of $f_1$.

In effect, the coaxial resonator 16 and its associated elements function as a harmonic mixer circuit so arranged that the signal frequency $f_3$ is prevented from entering into the local oscillator supply, thus minimizing losses of signal energy. An explanation of how this result is achieved follows. The incoming signal waves of frequency $f_3$ serve to excite the resonator at its resonant frequency, which is the same as the signal frequency $f_3$. The frequency $f_1$ of the local oscillations is chosen to be somewhat less than half of the frequency of the incoming waves $f_3$. The line stub 24 is open-circuited and has an electrical length greater than its physical length due to the additional distributed capacity between itself and the inner conductor over its entire length which is added by the presence of dielectric 26. It is thus possible to have an inner conductor 18 a quarter wavelength long electrically and a line stub insert 24 also a quarter wavelength long, at the same frequency $f_3$, contained within the conductor 18. Because line stub 24 is open-circuited, the impedance between junction point P and the inner conductor 18 is very low at the signal frequency $f_3$. Stated otherwise, stub 24 and the dielectric tube 26 may be considered as acting effectively as a bypass condenser between the inner conductor 18 and that end of the crystal 34 which is connected to point P, solely for energy of the signal frequency $f_3$. Signal energy is thus prevented from entering into the local oscillator supply circuit 30. However, the input impedance of the stub 24 and tube 18 at point P for the local oscillations of frequency $f_1$ is reasonably high and it is therefore possible to inject currents of frequency $f_1$ in series with crystal 34 and inner conductor 18. Due to the action of the non-linear detector 34 there will also be currents flowing in 34 which are harmonics of the local oscillator frequency $f_1$. The non-linear characteristic of the crystal detector 34 produces substantially the same effect as though the local oscillator frequency $f_1$ were substantially two or three times as high as its actual value. Hence, energy at a multiple of the local oscillator of frequency $f_1$ entering from coaxial line 30 will be added at the junction point P to the signal energy of frequency $f_3$ and be effectively in series with the equivalent signal generator of frequency $f_3$ and also in series with the crystal detector 34.

The impedance looking into the local oscillator supply line 30 at the intermediate frequency $f_2$ must be kept low to minimize losses of this current component which has been generated in the mixer. In this embodiment this is accomplished by the use of a loop 29 having a negligible impedance at frequency $f_2$.

Output from the harmonic mixer circuit of intermediate frequency $f_2$ is supplied by lead 36 to the first stage of the intermediate frequency amplifier. This first stage is shown as including a parallel tuned circuit 40 whose coil acts as a matching transformer to match the impedance of the crystal mixer to the impedance of the first amplifier vacuum tube 42. Other well known forms of I. F. input matching circuits may of course be used.

Figures 2, 3, 4:
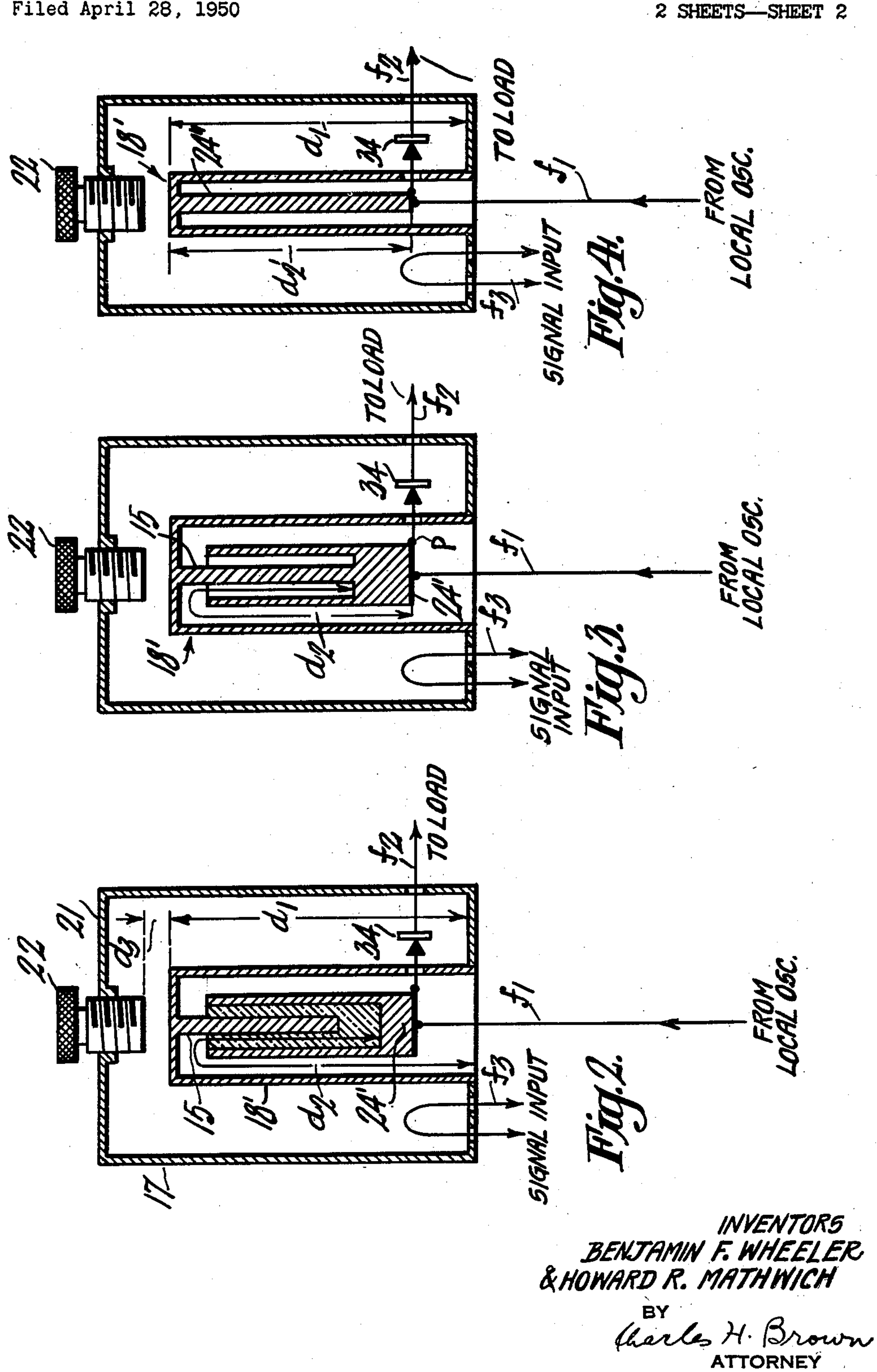
Fig. 2 illustrates another embodiment of the invention utilizing a coaxial line resonator with a re-entrant auxiliary line stub. These parts are sections of cylindrical elements.
Figs. 3 and 4 illustrate other embodiments of the invention utilizing auxiliary line stubs directly connected at one end to the inner conductor of the coaxial line resonator.

Figs. 2, 3 and 4 show various modifications of the coaxial line resonator which can be used in the harmonic mixer resonator circuit of the invention. Only those portions have been shown in these modifications which are necessary for an understanding thereof. The intermediate frequency amplifier stages and the receiving antenna system for use with the resonator may be the same as the circuits disclosed in Fig. 1.

In Fig. 2, the coaxial line resonator is shown as being of the re-entrant type, in which the inner conductor is provided with a metallic re-entrant portion or rod 15. The transmission line stub 24′ is U-shaped and surrounds the rod 15. Only cross-sections of the cylindrical elements are shown in Fig. 2. The effective length $d_2$ of the line stub 24′, it will be noted, is physically greater than the effective dimension $d_1$ of the inner conductor. Here again, as in Fig. 1, the dimensions of the inner conductor of the coaxial resonator and of the line stub can be a quarter of a wavelength or any odd multiple thereof at the signal frequency $f_3$. In Fig. 2, by way of example, the inner conductor 18′ of the resonator may have a length $d_1$ three-quarters of a wavelength long, while the line stub 24′ may have an effective electrical length which is five-quarters of a wavelength long. The electrical length of the line stub is measured by $d_2$ and is in this case required to be an odd multiple of one-quarter wavelength at the signal frequency.

The modification of Fig. 3 differs from Fig. 2 in directly connecting the metallic base of the line stub 24′ to the re-entrant portion 15 of the inner conductor of the resonator. In effect, therefore, the line stub is now a closed or short-circuited line. With this arrangement, in order to present a low impedance to signal frequency $f_3$ at point P, the electrical length $d_2$ should be an even multiple of one-quarter wavelength.

In Fig. 4, the line stub or insert 24″ is short-circuited at the end thereof remote from the local oscillator supply to the inner conductor of the coaxial resonator. The electrical length $d_2^1$ of the line stub 24″ in this embodiment is one-half wave-length or any integral multiple thereof at the signal frequency $f_3$. This would require that $d_1$ be ¾ wave, 5/4 wave, or some odd multiple of a quarter wavelength long. As mentioned above in connection with Fig. 1, the signal frequency $f_3$ corresponds to the resonator frequency of the coaxial resonator. The length $d_1$ of the inner conductor 18′ of the resonator remains ¼ wavelength or an odd multiple thereof. This is also the case for Fig. 3.

Fig. 5 shows the harmonic mixer circuit of the invention utilizing a type of cavity resonator devoid of an inner conductor. The signal frequency $f_3$ is supplied to the cavity resonator 16′ via loop 14 for exciting the resonator at frequency $f_3$. The crystal detector 34 is coupled to the electromagnetic field within the resonator by means of a loop 11 and is placed partially within and partially outside the cavity resonator. The local oscillations are supplied from coaxial line 30 to the crystal 34 through a capacitor 9. This capacitor is a bypass condenser for both the signal frequency $f_3$ and the local oscillator frequency $f_1$. A transmission line stub 50, here shown as open-circuited is connected to the coaxial line 30. This line stub 50 is one-quarter of a wavelength long or an odd multiple thereof at the signal frequency, and provides a low impedance across the space S for energy of the signal frequency. This low impedance acts as a shunt path or short circuit to prevent energy of the signal frequency from entering the local oscillator supply. The output frequency $f_2$ from the harmonic coaxial resonator is, as before, the sum or difference of a harmonic of the local oscillator frequency and signal frequencies.

The following values are given by way of illustration only and may be used in practicing the invention: They apply to Fig. 1.

$f_1$=416 mc. to 442 mc.
$f_3$=920 mc. to 960 mc.
$f_2$=88 to 76 mc.
condenser 38=100 $\mu$f.
$d_1$=2.67″
$d_2$=1.92″
$d_3$=.72″ to 0.18″

The crystal detector 34 may be made of silicon and may be type 1N21B. The dielectric tube 26 may be made of polystyrene ($E$=2.5).

By way of example, a local oscillator frequency $f_1$ may be 442 mc. (megacycles) and the signal $f_3$ may be 960 mc. If the harmonic mixer of the invention were not employed, the normal local oscillator frequency would be 884 mc. in order to give a difference frequency $f_2$ of 76 mc. The harmonic mixer of the invention, however, due to the non-linear action of the crystal detector 34, develops the desired 884 mc. or double frequency component of the frequency $f_1$. Other harmonics of the local oscillator frequency $f_1$ are also generated in the crystal, but are not objectionable.

In the embodiments described, the presence of dielectric material between inner conductor 18 and the auxiliary stub 24, or its variations 15 and 50, is not essential to the operation of the invention. From a practical standpoint, however, in order to make the dimensions work out properly, some sort of dielectric is highly desirable and in most cases necessary, while its additional convenience in supporting the auxiliary stub is also desirable. The effect of dielectric material on the effective electrical length of coaxial systems is well known.

We claim:

1. A harmonic mixer comprising a coaxial resonator having hollow inner and outer conductors connected together at one end, a third conductor within said hollow inner conductor and extending along the length thereof, dielectric means spacing said third conductor from said inner conductor, means for exciting said resonator with energy of predetermined frequency, a connection for supplying one end of said third conductor with oscillations of a frequency which is less than one-half said predetermined frequency, a non-linear detector in said resonator connected between said one end of said third conductor at a point P and a connection adapted to extend externally of said resonator, said third conductor having an effective electrical length at said predetermined frequency which provides a low impedance at such frequency between the point P and said inner conductor.

2. A harmonic mixer in accordance with claim 1, characterized in this, that said third conductor is open-ended and electrically one-quarter of a wavelength long or an odd multiple thereof at said predetermined frequency.

3. A harmonic mixer in accordance with claim 1, characterized in this, that said third conductor is directly connected to said inner conductor at the end opposite that at which oscillations are supplied to said third conductor, said third conductor having a length electrically equal to one-half wavelength or an integral multiple thereof at said predetermined frequency.

4. A harmonic mixer comprising a coaxial resonator having hollow inner and outer conductors directly coupled together at one end and spaced apart at the other end, a hollow tube of dielectric material within said hollow inner conductor, a rod-like conductor within said tube of dielectric material and having a length shorter than said dielectric tube, whereby said inner conductor is longer than said rod-like conductor but spaced therefrom, said inner conductor and rod-like conductor having the same effective electrical lengths at the resonant frequency of said resonator, means for exciting said resonator at said resonant frequency, a connection for supplying recurring waves of a frequency appreciably different from said resonant frequency to said rod-like conductor at the end thereof nearest the directly coupled end of said inner and outer conductors, and a non-linear crystal detector positioned in the space between said inner and outer conductors and connected between said connection and an output connection for said resonator.

5. A mixer circuit comprising a hollow electrical resonator, means for exciting said resonator at a signal frequency, a nonlinear detector coupled to the electro-magnetic field within said resonator, means for supplying local oscillations of a frequency substantially different from said signal frequency to said detector, a transmission line stub connected to said last means and having an electrical length and being terminated to present a path of low impedance to said signal frequency across the means which supplies said local oscillations, and means connected to said detector for deriving a beat frequency corresponding to the sum or difference between the signal frequency and a harmonic of the local oscillation frequency.

6. A mixer circuit comprising a hollow electrical resonator, means for exciting said resonator at a signal frequency, a nonlinear detector within said resonator, means for supplying local oscillations of a frequency substantially different from said signal frequency to said detector, a transmission line stub positioned within said resonator and connected to one end of said detector and to said last means, said stub having an electrical length and being terminated to present a path of low impedance to said signal frequency across the means which supplies said local oscillations, and means connected to the other end of said detector for deriving a beat frequency corresponding to the sum or difference between the signal frequency and a harmonic of the local oscillation frequency.

7. A mixer circuit comprising a hollow electrical resonator, means for exciting said resonator at a signal frequency, a non-linear detector coupled to the space within said resonator, means for supplying local oscillations of a frequency substantially different from said signal frequency to said detector, a transmission line stub connected to said last means and having an electrical length and being terminated to present a path of low impedance to said signal frequency across the means which supplies said local oscillations, and means connected to said detector for deriving a beat frequency corresponding to the sum or difference between the signal frequency and a harmonic of the local oscillation frequency, said line stub comprising an open-ended section of line which is electrically one-quarter of a wavelength long or an odd multiple thereof at the signal frequency.

8. A mixer circuit comprising a hollow electrical resonator, means for exciting said resonator at signal frequency, a non-linear detector coupled to the space within said resonator, means for supplying local oscillations of a frequency substantially different from said signal frequency to said detector, a transmission line stub connected to said last means having an electrical length and being terminated to present a path of low impedance to said signal frequency across the means which supplies said local oscillations, and means connected to said detector for deriving a beat frequency corresponding to the sum or difference between the signal frequency and a harmonic of the local oscillation frequency, said line stub comprising a closed section of line which is electrically one-half of a wavelength long or an integral multiple thereof at the signal frequency.

9. A harmonic mixer comprising a coaxial resonator having hollow inner and outer conductors directly coupled together at one end and spaced apart at the other end, a rod-like conductor within said inner conductor and physically spaced therefrom over its entire length, said rod-like conductor being physically shorter than said surrounding inner conductor but having the same effective electrical length at the resonant frequency of said resonator, means for exciting said resonator at said resonant frequency, a connection for supplying recurring waves of a frequency appreciably different from said resonant frequency to said rod-like conductor at the end thereof nearest the directly coupled end of said inner and outer conductors, and a non-linear crystal detector positioned in the space between said inner and outer conductors and connected between said connection and an output connection for said resonator.

10. A mixer circuit comprising a hollow electrical resonator, means for exciting said resonator at a signal frequency, a non-linear detector coupled to the electromagnetic field within said resonator, a local oscillator having a frequency substantially different from said signal frequency, a tuned coaxial line coupling said oscillator to said detector, means connected to said coaxial line for presenting a path of low impedance to said signal frequency across said line at a point adjacent said detector, and means connected to said detector for deriving a beat frequency corresponding to the sum or difference between the signal frequency and a harmonic of the local oscillator frequency.

11. A mixer circuit comprising a hollow electrical resonator, means for exciting said resonator at a signal frequency, a non-linear detector coupled to the electromagnetic field within said resonator, a local oscillator having a frequency substantially different from said signal frequency, a tuned coaxial line coupling said oscillator to said detector, a transmission line stub connected to said line and having an electrical length and being terminated to present a path of low impedance to said signal frequency across said line at a point adjacent said detector, and means connected to said detector for deriving a beat frequency corresponding to the sum or difference between the signal frequency and a harmonic of the local oscillator frequency.

BENJAMIN F. WHEELER.
HOWARD R. MATHWICH.

REFERENCES CITED

The following references are of record in the file of this patent:

UNITED STATES PATENTS

| Number | Name | Date |
|---|---|---|
| 2,408,420 | Ginzton | Oct. 1, 1946 |
| 2,412,805 | Ford | Dec. 17, 1946 |
| 2,416,565 | Beggs | Feb. 25, 1947 |
| 2,433,387 | Mumford | Dec. 20, 1947 |
| 2,435,541 | Herold et al. | Feb. 3, 1948 |
| 2,455,657 | Cork et al. | Dec. 7, 1948 |